(12) United States Patent
Murakami

(10) Patent No.: US 7,822,566 B2
(45) Date of Patent: Oct. 26, 2010

(54) METHOD, DEVICE AND PROGRAM FOR SETTING A REFERENCE VALUE FOR SUBSTRATE INSPECTION

(75) Inventor: Kiyoshi Murakami, Kyoto (JP)

(73) Assignee: OMRON Corporation, Kyoto (JP)

( * ) Notice: Subject to any disclaimer, the term of this patent is extended or adjusted under 35 U.S.C. 154(b) by 698 days.

(21) Appl. No.: 11/824,277

(22) Filed: Jun. 28, 2007

(65) Prior Publication Data
US 2008/0046210 A1 Feb. 21, 2008

(30) Foreign Application Priority Data
Jun. 29, 2006 (JP) .............................. 2006-180225

(51) Int. Cl.
G01N 37/00 (2006.01)
(52) U.S. Cl. ........................................................ 702/82
(58) Field of Classification Search ................... 702/82, 702/35; 29/840, 84
See application file for complete search history.

(56) References Cited

U.S. PATENT DOCUMENTS 5,564,183 A * 10/1996 Satou et al. .................... 29/840
6,757,621 B2 * 6/2004 Mizuno et al. ................. 702/35

FOREIGN PATENT DOCUMENTS

| EP | 1578186 | 9/2005 |
| JP | 05-108798 | 4/1993 |
| JP | 11-298200 | 10/1999 |

OTHER PUBLICATIONS

EP patent application No. 07110486.3, European Search Report mailed Mar. 26, 2009.

\* cited by examiner

*Primary Examiner*—Tung S Lau
*Assistant Examiner*—Xiuquin Sun
(74) *Attorney, Agent, or Firm*—Weaver Austin Villeneuve & Sampson LLP

(57) ABSTRACT

Where substrates with components are produced through a series of production processes and inspected after each of these production processes, a method is provided for setting an optimum reference value for making judgments in these inspections such that the frequency of occurrence of disagreement between inspection results after an intermediate process and after the final results will come to within a specified range. After an initial value is assigned for a reference value, this value is sequentially varied while repeating specified processes of saving measured and judgment data on inspected portions of components in a memory and setting a reference value by using the data saved in the memory until a specified condition becomes satisfied.

5 Claims, 6 Drawing Sheets

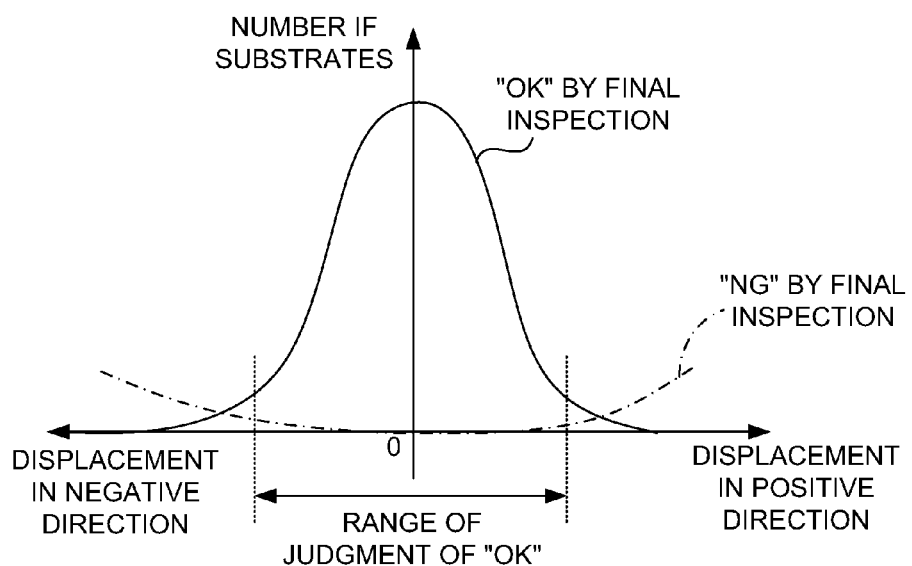
FIG. 4
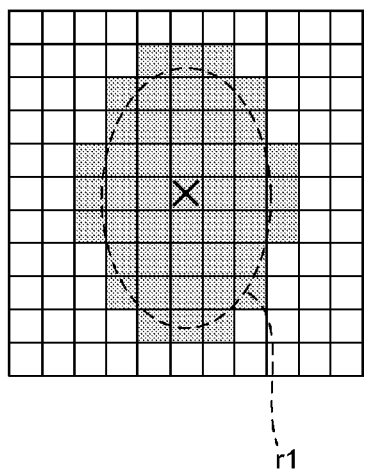 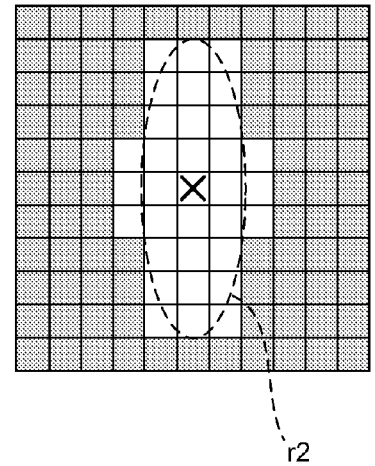
FIG. 5A  FIG. 5B

METHOD, DEVICE AND PROGRAM FOR SETTING A REFERENCE VALUE FOR SUBSTRATE INSPECTION

This application claims priority on Japanese Patent Application 2006-180225 filed Jun. 29, 2006.

BACKGROUND OF THE INVENTION

This invention relates to a method of setting a reference value for judging (whether good or no good) a measured value of a target portion for inspection on a substrate after it has gone through an intermediate process for the production of substrates having components mounted thereto. The invention also relates to a device for carrying out such a method.

The production line for substrates having components mounted thereto (hereinafter sometimes referred to simply as "substrates") is usually comprised of a plurality of production processes such as a printing process for cream solder by using a solder printer, a component mounting process by using a mounter and a soldering process by using a reflow oven. An inspecting device is provided on the downstream side of at least the soldering process, which is the last of the processes mentioned above, for inspecting the condition of the mounted components and the soldering, as described, for example, in Japanese Patent Publication Koho 3622749.

More recently, substrate inspection systems providing each process with an inspecting device and networking these inspecting devices are coming to be proposed, as disclosed, for example, in Japanese Patent Publication Tokkai 2005-303269. With such a system, the user can use a server or a terminal device within the network to read out and compare the inspection results and images of a same substrate after each of the processes and to thereby analyze the cause of defects found in the final products.

In conventional inspection methods of substrates, it is frequently the practice to use the same reference value of judgment set for another component of the same kind on the same substrate in order to improve the teaching efficiency. There are situations, however, where components of the same kind may have different results in the final process, depending on the conditions under which they are placed, although their conditions may have been similar until an intermediate process. Consider, for example, a situation as shown in FIG. 9 where components 100a and 100b of similar kinds are contained respectively in an area A with a high component density and another area B with a low component density. Since the degree of heat conduction for solder will be different between the areas A and B, the components 100a and 100b may experience different displacements due to the melting solder.

Thus, even if both components 100a and 100b experience about the same positional displacements during a component mounting process, as an example, self-alignment due to the surface tension of the melted solder is likely to come about in the case of the component 100b in area B and hence its displacement is likely to be dissolved but the displacement of the component 100a in area A may not as easily dissolved.

As another example, let us assume that cream solder was applied to both components 100a and 100b in a solder printing process both in an amount equally greater than a specified reference quantity. In such a situation, it may happen that abnormalities do not occur with the component 100a in the area A where solder does not easily melt but that solder flows outside the land and a displacement occurs in the case of the component 100b in the area B.

In other words, even among components of the same kind, their conditions after the final process may become different although their conditions after an intermediate process may be similar, depending on their positions and mounting densities. Thus, if the same reference value is used for components of the same kind in the inspection of an intermediate process, the results of the inspection may disagree with those of the final process.

In view of the above, it is preferable to set different reference values for individual components but the inspection results may fail to agree even if this is done. This is because fluctuations may result in the conditions of substrates after the final process for various reasons such as the temperature changes in the reflow oven even if the conditions up to an intermediate process on components of the same kind mounted at the same position are the same.

Thus, the common practice is to carry out inspections by conceding that it is inevitable that the results of an intermediate process and the final process may disagree to a certain degree and to reset the reference value for judgment only when the frequency of occurrence of disagreement exceeds an intended allowable range.

It is not easy for a person to judge, however, how to set a reference value such that the frequency of occurrence of disagreement in inspection results is reduced to within the user's intended range. For this reason, a conventional method was by trial and error while checking each of the past inspection results but the burden on the user is enormous by such a method.

SUMMARY OF THE INVENTION

It is therefore an object of this invention in view of the above to set a reference value for judgment in order to reduce the frequency of disagreement between the inspection results associated with an intermediate process and the final process (such as when it was judged to be good after an intermediate process but is judged to be no good after the final process, or when it was judged to be no good after an intermediate process but is judged to be good after the final process) to within a preliminarily set allowable range such that an inspection of substrates intended by the user can be carried out.

This invention relates in part to a method of setting an optimum reference value for judging a measured value of a target portion for inspection of substrates having components mounted thereto after an intermediate process. These substrates are produced through a plurality of production processes inclusive of the aforementioned intermediate process and a final process that is the last of these production processes.

In this method, target portions on a plurality of substrates of a same kind are individually measured in a measurement process after the intermediate process is carried out, and the mounted condition of each component is judged in a judgment process after the final process is carried out. The results of these measuring and judging steps are saved in a memory.

Next, after an initialization process in which a reference value for target portions for inspection that can use the reference value in common among these plurality of substrates is initialized, a process of calculating the number of substrates for which measured values within a range of no good (NG) or good (OK) have been obtained according to this reference value and for each of which a judgment of OK or NG has been respectively given in the judgment process after the final process is repeatedly carried out, each time by varying the aforementioned reference value.

Thereafter, the reference value as of the time when the ratio of this calculated number of substrates with respect to the total number of substrates for which the aforementioned results of measuring and judging steps are saved in the memory is within a preliminarily set allowable range of occurrence of disagreement in judgment in inspections after the aforementioned intermediate process and the final process is set as the desired optimum reference value.

In the above, the target portions for inspection that can use the reference value in common among a plurality of substrates may preferably refer to components to be mounted at the same position if the inspection is on substrates after their component mounting process. In the case of the inspection after the solder printing process, this method may be applied for lands expected to be at the same positions of components to be mounted at the same positions. In these cases, one target portion for inspection is identified for each substrate.

The number of target portions for inspection for each substrate is not limited to be one but may be more than one. Since it is possible to use a same reference value if each substrate has a plurality of components of a same type but if there are no large differences among these components regarding surrounding environment such as the mounting density, the method of this invention may be applied by using these components as targets of processing.

According to one preferable embodiment of this invention, the aforementioned step of initializing a reference value comprises the steps of retrieving out of the memory measured values obtained in the measurement process after the intermediate process regarding substrates for which judgment results of OK or NG were obtained in the judgment process after the final process on a target portion for which the reference value was used in common among the plurality of substrates and defining as initial value of the reference value a measured value corresponding to a boundary position between a range in which the retrieved measured values are distributed and another range in which these retrieved measured values are not distributed.

As another example, a value set by the user may be used as the initial reference value. If reference data for inspection (library data) are already prepared for each component type, a reference value shown by their reference data may be used as the initial value. When this invention is being used for correcting an already set reference value, this target value to be corrected may be used as the initial value.

After the aforementioned initialization step is carried out, the number of substrates for which the target portion for inspection was judged to be OK in the judgment process after the final process and for which a measured value within the range of NG according to the reference value was obtained in the measurement process may be calculated. This means obtaining the number of substrates, which are judged to be NG by the inspection after the intermediate process according to the reference value that has been set but judged to be OK in the inspection after the final process. This kind of disagreement in judgment is referred to as the false positive judgment.

According to another embodiment of the invention, the number of substrates for which the target portion for inspection was judged to be NG in the judgment process after the final process and for which a measured value within the range of OK according to the reference value was obtained in the measurement process is calculated after the initialization step is carried out. This means obtaining the number of substrates, which are judged to be OK by the inspection after the intermediate process according to the reference value that has been set but judged to be NG in the inspection after the final process. This kind of disagreement in judgment is referred to as the false negative judgment.

By carrying out these methods of setting a reference value for inspecting substrates, a reference value for which the ratio of the number of substrates for which false positive or negative judgment occurred with respect to the total number of substrates (or the false positive or negative ratio) comes to be within a range set by the user can be easily set. In other words, a reference value with which the frequency of occurrences of disagreement in judgment in inspections after the intermediate and final processes will fall within an allowable range set by the user can be easily set by a method of this invention.

A device for carrying out the method of this invention as characterized above may be characterized as comprising first input means for inputting measurement results on target portions for inspection from an inspection device associated with the intermediate process and judgment results from another inspection device associated with the final process, a memory for storing data inputted from the first input means, second input means for inputting data on an allowed value related to frequency of occurrence of disagreement between the measurement results and the judgment results, reference setting means for using the data stored in the memory and the allowed value inputted by the second input means and thereby setting a reference value corresponding to target portions for inspection that use the reference value in common among a plurality of substrates of a same kind, and output means for outputting the reference value set by the reference setting means to the inspection device associated with the intermediate process. The reference setting means repeats over target portions for processing, after initializing the reference value, the process of calculating the number of substrates for which measured values within a range of NG or OK have been obtained according to the reference value and for each of which a judgment of OK or NG has been respectively given in the final process while varying the reference value and sets as optimum reference value the value of the reference value when the ratio of the calculated number of substrates with respect to the total number of substrates for which the measurement results and the judgment results are stored in the memory corresponds to the allowed value.

With a device thus structured, it is possible to reset the reference value for judgment, after certain numbers of substrates have been inspected by the inspection devices associated with the intermediate and final processes, such that the frequency of occurrence of disagreement will come to be of a value corresponding to the allowed value regarding a target portion for inspection for which the frequency of occurrence of disagreement in the inspection result of each production process exceeds the allowed value inputted from the second input means. When a reference value for judgment is adjusted by a test inspection prior to a real inspection, the reference value may be set by using each target portion for inspection sequentially as the target of processing.

The invention further relates to a computer-readable medium encoding a program for having a computer to carry out a reference-setting process of this invention as described above. Such a program may comprise a data-saving step of saving in a memory of the computer measurement results on target portions for inspection by an inspection device associated with the intermediate process and judgment results on the target portions for inspection by another inspection device associated with the final process, and a reference-setting step of using, when a target value related to frequency of occurrence of disagreement between the measurement results and the judgment results is inputted to the computer, the data saved in the memory and the target value inputted to the computer to set a reference value corresponding to target portions for inspection that use the reference value in common among a plurality of substrates of a same kind. The reference-setting step is repeated over target portions for processing, after initializing the reference value regarding a target portion for inspection, the process of calculating the number of substrates for which measured values within a range of NG or OK have been obtained according to the reference value and for each of which a judgment of OK or NG has been respectively given in the final process while varying the reference value and sets as optimum reference value the value of the reference value when the ratio of the calculated number of substrates with respect to the total number of substrates for which the measurement results and the judgment results are stored in the memory corresponds to the target value.

By the method or the device of this invention as described above, a reference value for judgment can be easily set such that the frequency of occurrence of disagreement between the inspection results after an intermediate process and the final process of production will come to be within a range set by the user. In other words, the user is no longer required to rely on a trial-and-error method in setting a reference value for judgment and the accuracy in inspection can be reliably stabilized.

BRIEF DESCRIPTION OF THE DRAWINGS

FIG. 4 is a graph for showing the relationship between the result of final inspection and measured displacement values.

FIGS. 5A and 5B show frequency distributions represented by OK and NG histograms.

DETAILED DESCRIPTION OF THE INVENTION

Figure 1:
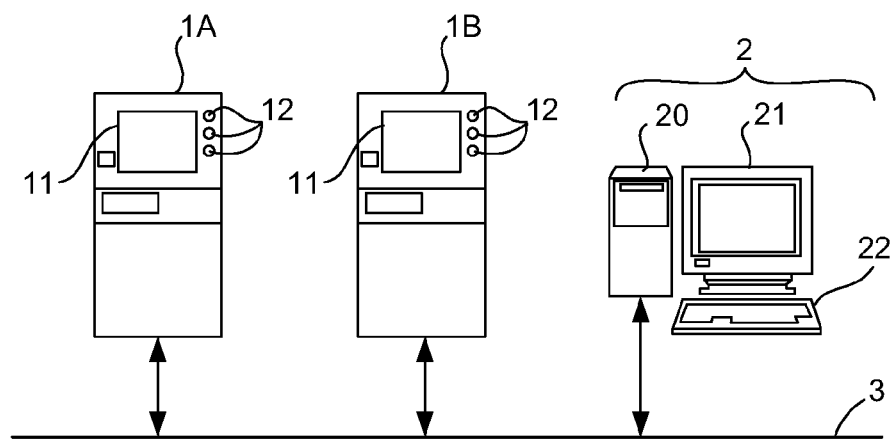
FIG. 1 shows an example of the structure of a substrate inspection system.

FIG. 1 shows an example of the structure of a substrate inspection system embodying this invention, comprising two (first and second) inspection devices 1A and 1B connected to a data processor 2 through a communication line 3. The first inspection device 1A is for substrates which have just passed through the component mounting process by means of a mounter (not shown) and serves to inspect the displacements of the components and the presence or absence of mounted components. The second inspection device 1B is for substrates which have just passed through the soldering process by means of a reflow oven (not shown) and serves to inspect the fillets formed on the lands on each component. Both inspection devices 1A and 1B are provided with a liquid crystal panel 11 and switches 12.

The data processor 2 has a personal computer 20 as its main component and also includes peripheral devices such as a monitor 21 and a keyboard 22. The data processor 2 serves to receive from the inspection devices 1A and 1B inspection results as well as measured values and images that were used for the inspection and to record them in a memory (not shown). It also serves to retrieve an image used in the inspection to display it on the monitor 21 in response to a call operation by the user and to receive an input such as the user's evaluation on such an image.

Although FIG. 1 shows an example of a system including inspection devices for inspecting substrates after the component mounting process and after the soldering process which is the final inspection process, this is not intended to limit the scope of the invention. Still another inspection device for substrates after the solder printing process may also be set to include in the inspection system.

Figure 2:
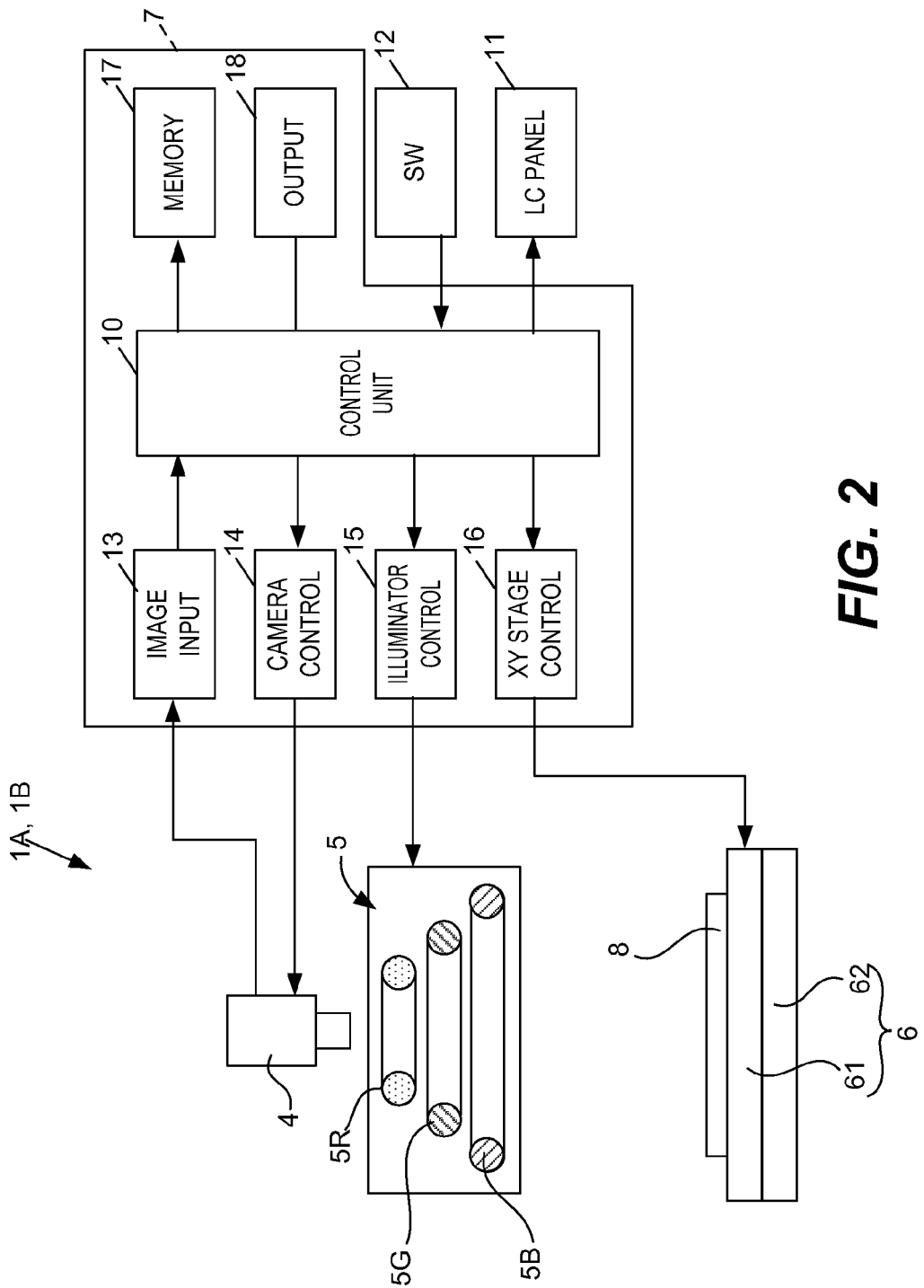
FIG. 2 is a block diagram showing the common structure of the inspection devices 1A and 1B of FIG. 1.

FIG. 2 shows the principal structure of the inspection devices 1A and 1B. The inspection devices 1A and 1B are each provided with a camera 4, an illuminator 5, a substrate stage 6 and a control processor 7. The liquid crystal panel 11 and the switches 12 shown in FIG. 1 are connected to a control unit 10 within the control processor 7.

The substrate stage 6 includes a table 61 for supporting a substrate 8 and a moving mechanism 62 including an X-stage and a Y-stage (not shown). The camera 4 is for producing still color images and is set above the substrate stage 61 with its image taking surface facing downward and its optical axis oriented vertically.

The illuminator 5 is provided between the substrate stage 6 and the camera 4. According to the illustrated example, the illuminator 5 includes three annular light sources 5R, 5G and 5B for emitting red, green and blue light, respectively, disposed with their centers on the optical axis of the camera 4. These three light sources 5R, 5G and 5B have different diameters so as to be able to irradiate the substrate 8 from different directions.

The control processor 7 is provided not only with the control unit 10 comprising a computer but also with an image input part 13, a camera control part 14, an illuminator control part 15, an XY stage control part 16, a memory 17, and an inspection result output part 18.

The image input part 13 includes an interface circuit for the camera 4. The camera control part 14 is for outputting a timing signal to the camera 4 for ordering it to obtain an image.

The illuminator control part 15 controls the switching on and off of each of the light sources 5R, 5G and 5B of the illuminator 5 and adjusts the quantities of light. The XY stage control part 16 controls the timing of motion and the distance of displacement of the substrate stage 6.

The memory 17 stores programs describing series of process steps related to inspections and inspection data files. For each of target portions for inspection, the inspection data files store set data on the inspection area, binarization threshold values for detecting the target portions for inspection in the inspection area, reference values for judgment for judging whether measured value is appropriate or not for the detected target portion for inspection, etc.

The control unit 10 serves to move the camera 4 sequentially to the positions of the components by controlling the motion of the substrate stage 62 through the XY stage control part 16 and to take images. The color image thus taken is inputted to the control unit 10 through the image input part 13 and stored in its internal memory (such as a RAM). For each target portion of inspection of the color image thus stored in the RAM, the control unit 10 sets inspection areas by using the aforementioned inspection data files and thereafter carries out the inspection, measurement and judgment processes of the target portions for inspection sequentially in that area.

The control unit 10 further serves to transmit the results of measurement and judgment on each target portion for inspection as well as the images used for the inspection through the inspection result output part 18 to the data processor 2.

The data processor 2 is provided with a memory with a large capacity (such as a hard disk (not shown)) having areas set corresponding to the individual inspection devices 1A and 1B. Data transmitted from these inspection devices 1A and 1B are stored in corresponding ones of these areas for each substrate.

The substrate 8 and the components thereon (not shown) are each assigned an identification code. In what follows, the code for the substrate 8 is referred to as the substrate code and the codes for the individual components are referred to as the component codes.

Every time an inspection on one component has been completed, each of the inspection devices 1A and 1B transmits to the data processor 2 the results of measurements and judgments made for that inspection by correlating them with the substrate code and the component code. For each substrate 8, the data processor 2 creates inside the memory a folder with a name including the substrate code of the corresponding substrate 8 and stores the data transmitted from the inspection device 1A or 1B in the folder corresponding to the substrate code give to these data. The component code of the corresponding component is assigned also to the data for each component stored in the folder, like the transmitted data. Thus, data on any specified component on any substrate can be read out by identifying the substrate code and the component code.

A program for correcting reference values for judgment set by the first inspection device 1A for the component mounting process is also stored in the data processor 2. A process according to this program can adjust the false positive and negative ratios in the inspection by the first inspection device 1A. According to a present embodiment of the invention, the user specifies the adjustment of false positive or negative ratio and inputs a target value such that the reference value for judgment can be automatically corrected. This specification by the user is carried out by using not only the keyboard 22 shown in FIG. 1 but also by using a mouse (not shown).

Next, the process for correcting a reference value for judgment is explained in detail as an example for the case of inspection of positional displacement of a component that is carried out by the first inspection device 1A for the component mounting process.

Figure 3:
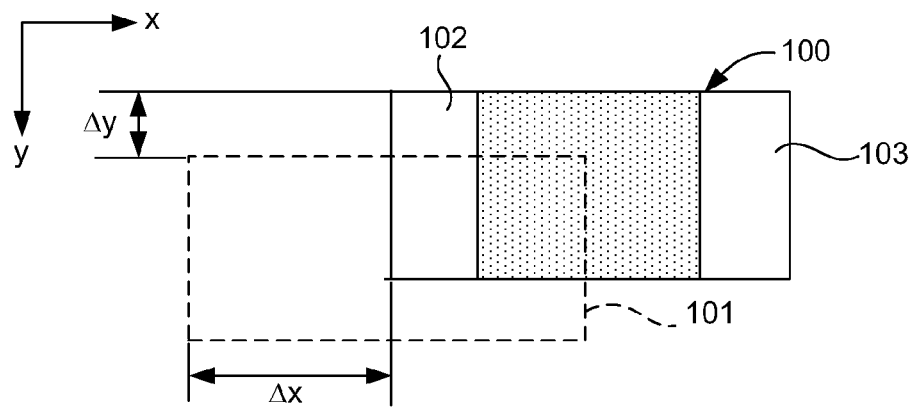
FIG. 3 is a drawing for explaining the method of measuring displacements.

FIG. 3 is referenced to explain a method of measuring the displacement of a chip component 100 carried out for the inspection of positional displacements. In this example, the direction in which electrodes 102 and 103 are arranged is defined as the x-direction, the direction perpendicular to it being the y-direction. The dotted frame 101 in the figure indicates the correct position for mounting this chip component 100.

In this example, the positions of the left-hand and upper edges of the component 100 are used as the reference positions and displacements Ax and Ay (either positive or negative, depending on the direction) from the correct positions of the edges are measured.

In the judgment process, too, reference values are set both in x and y directions (positive and negative) and displacements Δx and Δy are compared with these reference values. A judgment of "OK" is rendered if both Δx and Δy are within the range of "OK" indicated by the judgment reference values. If either Δx or Δy is outside the range of "OK", a judgment of "NG" (no good) is given.

FIG. 4 shows the displacements of specified chip components on a plurality of substrates of a same kind after the component mounting process in correlation with the result of the inspection which is carried out at the final soldering process (hereinafter referred to as the final inspection). In the figure, the solid curve indicates the distribution of displacements of the components judged to be "OK" in the final inspection and the chain line indicates that of the components judged to be "NG" in the final inspection. For the sake of convenience, FIG. 4 shows only the displacements in the x-direction but similar curves are also obtained for displacements in the y-direction although the heights and widths of the curves will be different.

According to the example of FIG. 4, the probability of being judged as "OK" in the final inspection becomes 100% if the displacement after the component mounting process is nearly 0. As the displacement becomes larger, the frequency of being judged as "NG" in the final inspection increases.

FIG. 4 is based on the displacements of components that are all intended to be mounted at the same position. No matter how the range of products to be judged "OK" in an inspection for displacement is defined, situations where the results of the inspection for displacement and final inspection cannot be made to agree, or situations of false positive and negative judgments, never fail to occur.

On a production line for substrates, the line may not be stopped and the substrates may be allowed to flow to the final process if the frequency of detecting defects in intermediate processes is within an allowable range. If a component judged as "NG" in the inspection after an intermediate process is also judged to be "NG" after the final process, such component judged to be "NG" may be repaired manually. If the standard of judgment in the inspection after the intermediate process is made stricter in order to reduce such manual work of repair, however, there may be an increase in the situation (of false positive judgment) where even those that would be judged "OK" in the final inspection are judged "NG" in the inspection after the intermediate process.

If the standard of judgment in the inspection after the intermediate process is made less strict, on the other hand, there will be an increase in the situation (of false negative judgment) where those judged to be "OK" in the inspection after the intermediate process are judged to be "NG" in the inspection after the final process, and more manual repair work will be required as a result. If a defect of the type that is difficult to finally repair manually is detected because of such false negative judgment, the substrate itself will turn out to be defective and will have to be discarded. This will mean an increased amount of loss.

Since an increase in either false positive or negative judgment is undesirable, it is preferable to adjust the reference values for judgment while taking into consideration the frequency of occurrence of false positive and negative diagnoses.

In view of the above, the data processor 2 according to the present embodiment of the invention is adapted to use the results of measurements at the time of inspection on measured displacement values and the results of the final inspection based on a plurality of substrates that have been processed, to thereby obtain the false positive and negative ratios for each component and to correct the judgment reference value for the inspection of displacements if these ratios are different from what the user intends.

When a judgment reference value is corrected, those substrates judged to be "OK" and "NG" in the final inspection are separated into groups and a histogram is created for each group for showing the distribution of displacements measured at the time of the inspection on displacements. The distribution curve shown in FIG. 4 is the section of this histogram along the x-direction, although the histogram is actually obtained as a function showing the frequency of occurrence of combination of displacements in the x and y directions.

In what follows, the histogram of the substrates judged to be "OK" in the final inspection carried out by the second inspection device 1B is referred to as the "OK histogram" and the histogram of the substrates judged to be "NG" is referred to as the "NG histogram".

FIGS. 5A and 5B show frequency distributions represented by OK and NG histograms. The length of each lattice represents a specified magnitude of displacement and the lattice at the center marked with "X" represents zero displacement. Each shaded lattice indicates where the frequency was at least 1 and the lattices that are not shaded indicate that the frequency was zero.

In the OK histogram of FIG. 5A, r1 indicates the largest elliptical area that can be drawn inside the shaded lattices where the frequency of distribution was zero. In the ND histogram of FIG. 5B, r2 indicates the largest elliptical area that can be drawn inside the white (not shaded) lattices where the frequency distribution was non-zero. If the ranges corresponding to the major and minor axes of these elliptical areas r1 and r2 are defined as corresponding to the judgment of "OK", the measured values in the NG histogram within the range of "OK" correspond to false negative judgment and the measured values in the OK histogram outside the range of "OK" correspond to false positive judgment.

According to the present example, the process of initially setting a judgment reference value for the inspection of displacements based on the distribution according to either the OK histogram or the NG histogram and thereafter obtaining the number of substrates resulting in false positive or negative judgment according to this judgment reference value is repeatedly carried out while changing the judgment reference value. When the ratio of the calculated number of substrates with respect to the total number of substrates becomes closest to the value preliminarily specified by the user, this judgment reference value is set as the optimum value.

Figure 6:
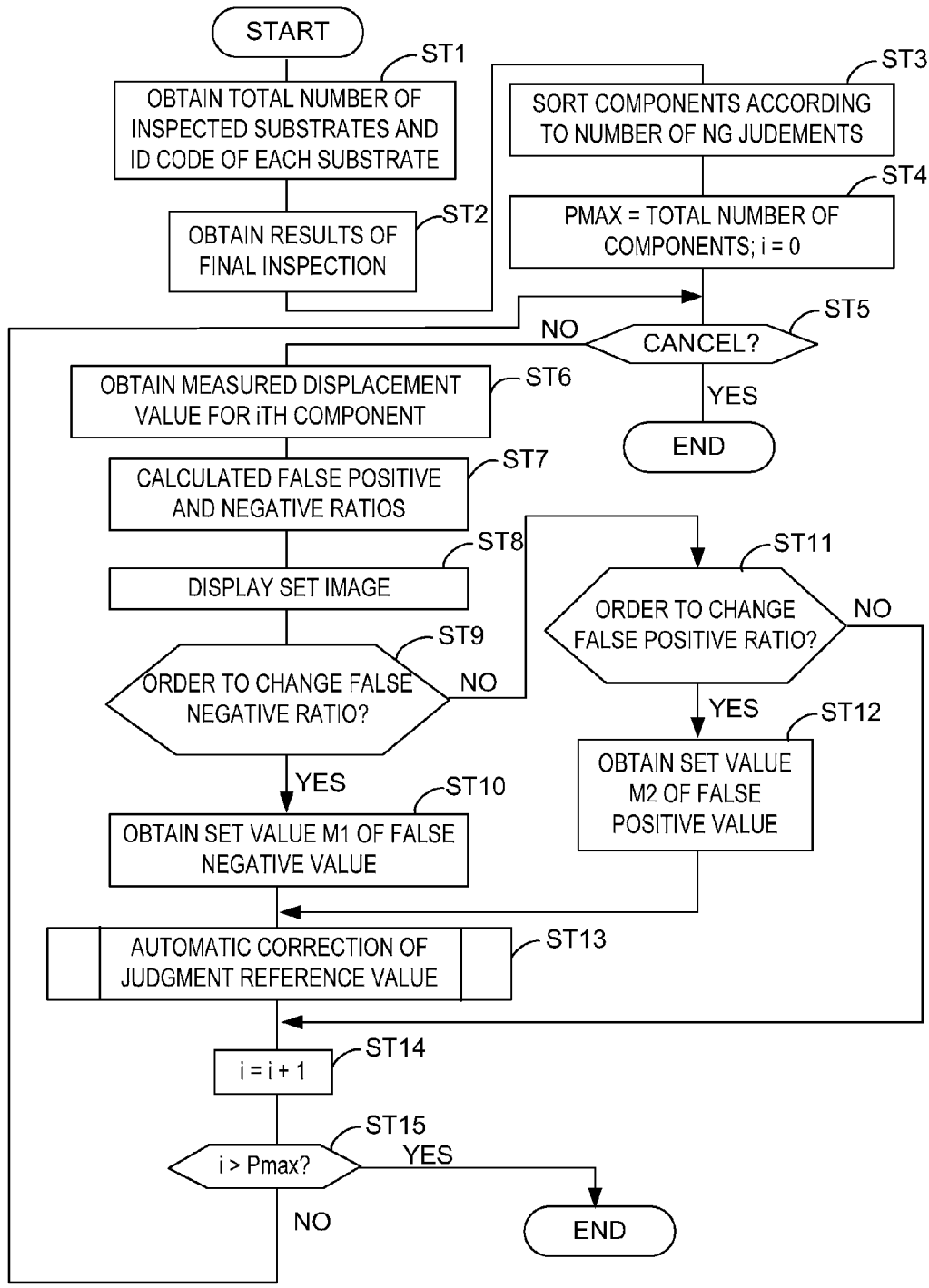
FIG. 6 is a flowchart of the process by the data processor.

FIG. 6 is a flowchart of a process carried out by the data processor 2 for correcting the judgment reference value for the inspection of displacements regarding a specified substrate.

The process starts by searching the data stored in the memory on the target substrate to be inspected and thereby obtaining the total number S of substrates processed by the inspection devices 1A and 1B and the identification codes of these substrates (Step ST1). Next, each of the identification codes obtained in Step ST1 is used to read out the results of the final inspection by the second inspection device 1B (Step ST2).

The results of inspection read out in Step ST2 include all inspection result data on all components. The inspection result data for each unit include the identification codes of the corresponding components (component codes) and the judgment results (OK or NG). The inspection result data for each substrate are processed for each component code so as to calculate the number of times a judgment of "NG" was given for each component and the components are sorted in the order of these calculated numbers (Step ST3).

Next, the total number of components mounted to the target substrate being inspected is set to $P_{max}$ and the counter i for identifying the component is initially set to 1 (Step ST4). Thereafter, the following processes are repeated by incrementing the counter value i until the counter value i reaches $P_{max}$ (YES in Step ST15) or a cancel operation is carried out (YES in Step S5).

In Step ST6, the measured displacement value calculated in the inspection of displacements on each substrate and the results of the inspection are obtained for the $i^{th}$ component. This is carried out by reading out data corresponding to the component code of the $i^{th}$ component from the folder corresponding to the substrate code of each substrate regarding the transmitted data from the first inspection device 1A.

Next, the inspection results obtained in Step ST6 and the results of the final inspection obtained in Step ST2 are compared for each substrate to calculate the false positive and negative ratios (Step ST7).

Next, a set image is displaced on the monitor 21 (Step ST8). Although no example of this image will be shown, not only the numerical values indicating the false positive and negative ratios but also check boxes for indicating a change in these numbers, an input box for inputting changed numbers, a confirmation button and a NEXT button (for moving on to the next component to be processed) will be displayed.

If the user then operates a check box for changing the false negative ratio, inputs a new number in the input box and further presses the confirmation button (YES in Step ST9), the number inputted in the input box is obtained as a set value M1 of the false negative ratio (Step ST10). If the user operates a check box for changing the false positive ratio, inputs a new number in the input box and further presses the confirmation button (YES in Step ST11), the number inputted in the input box is obtained as a set value M2 of the false positive ratio (Step ST12). If neither check box has been operated but the NEXT button is operated (NO in Steps ST9 and ST11), the counter value i is incremented (Step ST14).

If a set value M1 or M2 has been obtained in Step ST10 or ST12, a process for automatically correcting the judgment reference value is carried out (Step ST13).

Figure 7:
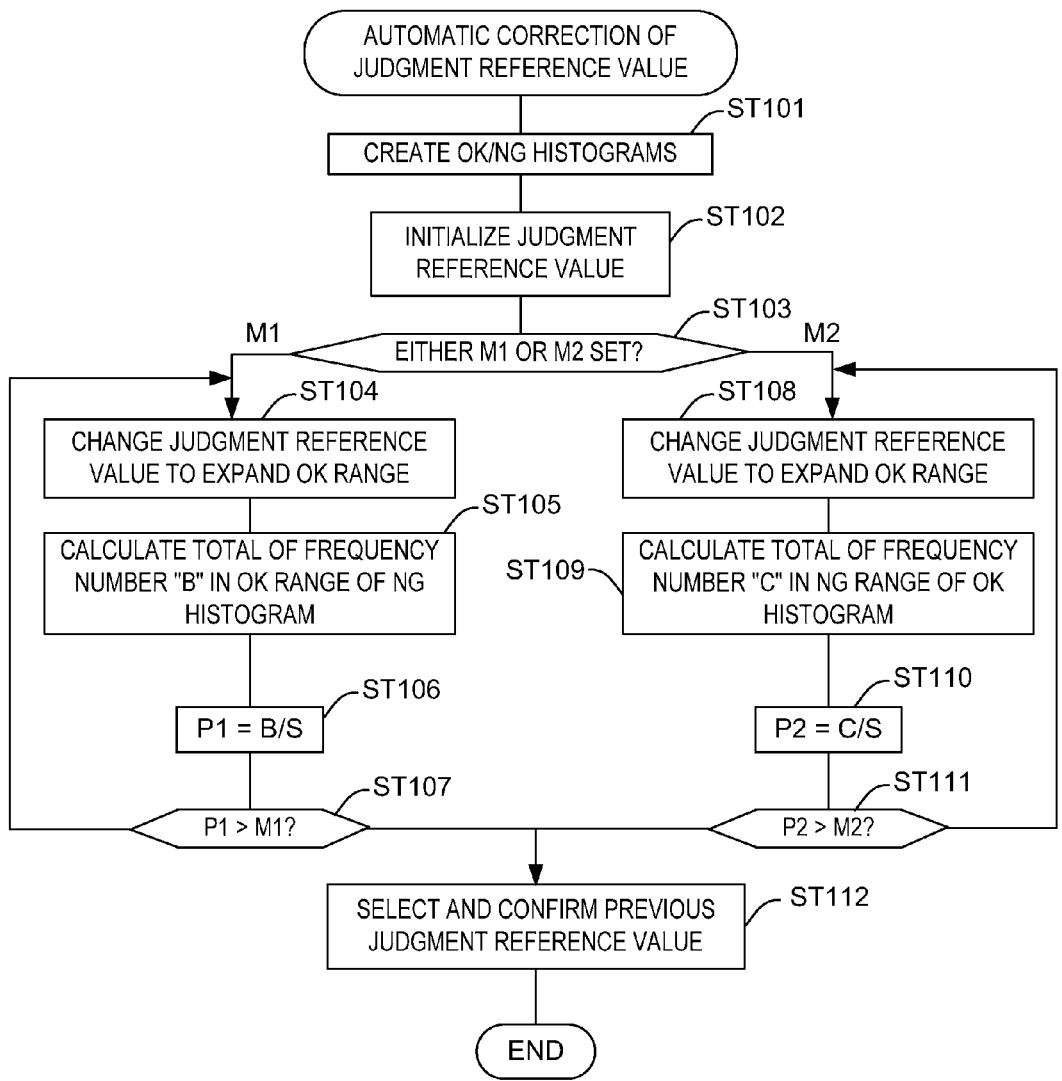
FIG. 7 is a flowchart of the process for automatic correction of judgment reference values.

FIG. 7 is a flowchart of this automatically correcting process. In this process, the OK histogram and the NG histogram are initially created (Step ST101). An elliptical area r2 is set in the lattices of the NG histogram where the frequency is zero and the measured values at the ends of its major and minor axes are defined as the initial judgment reference values (Step ST102). In other words, judgment reference values are set such that the interior of the elliptical area such as shown in FIG. 5B represents the range of "OK".

Next, if it is value M1 that has been set, processes of Steps ST104-ST107 are carried out and if it is value M2 that has been set, processes of Steps ST108-ST111 are carried out (Step ST103).

If M1 for false negative ratio has been set, the judgment reference values are changed such that the range of "OK" will expand (Step ST104). More specifically, this is done by changing the end points of each axes such that the major and minor axes of the ellipse r2 in FIG. 5B will increase by a fixed value.

Next, the total B frequency number included in this range of "OK" of the NG histogram is calculated (Step ST105). The total B thus calculated may be considered to be the total number of substrates for which the judgment process for the final inspection resulted in "NG" but a measured value included in the range of "OK" indicated by the judgment reference value was obtained. In other words, B may be considered the represent the number of substrates for which a false negative judgment not agreeing with the judgment process for the final inspection is made according to the judgment reference value being set.

Next, the number B thus obtained is divided by the total number S of substrates obtained in Step ST1 of FIG. 6 and this is defined as P1 (Step ST106).

Thereafter, processes of Steps ST104-ST106 are repeated until the value of P1 exceeds the set value M1 of the false negative ratio (YES in Step ST107). If P1 exceeds M1, the immediately previous judgment reference value before P1 exceeds M1 is selected and confirmed as the optimum judgment reference value corresponding to the set value M1 (Step ST112).

If it is M2 for false positive ratio that has been set, the judgment reference values are changed such that the range of "OK" will expand (Step ST108), as done in Step ST104.

Figure 8:
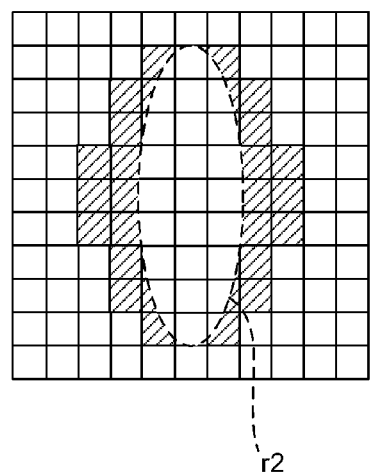
FIG. 8 is a drawing for explaining the calculation of the total value C in Step ST109 of FIG. 7.
Figure 9:
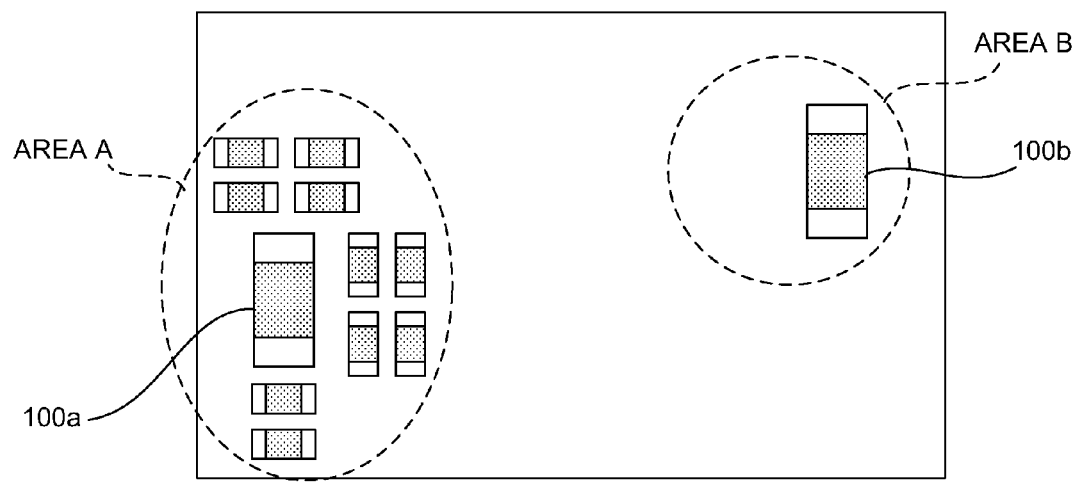
FIG. 9 is a drawing for explaining different mounting conditions of components.

Next, the total C frequency number included in this range of "NG" of the OK histogram is calculated (Step ST109), or the number outside the range of "OK". FIG. 8 shows the range for obtaining this total number C (except, for convenience, that the range of "OK" shown by elliptical range r2 is not expanded and is shown as in FIG. 5B). In this example, the total number C is calculated from the shaded portions, outside the ellipse r2, of the range where the frequency is 1 or over in the OK histogram.

The total C thus calculated may be considered to be the total number of substrates for which the judgment process for the final inspection resulted is "OK" but a measured value included in the range of "NG" indicated by the judgment reference value was obtained. In other words, C may be considered to represent the number of substrates for which a false positive judgment not agreeing with the judgment process for the final inspection is made according to the judgment reference value being set.

Next, the number C thus obtained is divided by the total number S of substrates and this is defined as P2 (Step ST110).

Thereafter, processes of Steps ST108-ST110 are repeated until the value of P2 exceeds the set value M2 of the false negative ratio (YES in Step ST111). If P2 exceeds M2, the immediately previous judgment reference value before P2 exceeds M2 is selected and confirmed as the optimum judgment reference value corresponding to the set value M2 (Step ST112).

As the user indicates the correction of false positive or negative ratio and inputs set value M1 or M2, the judgment reference values are automatically corrected by the processes of FIGS. 6 and 7 such that the false positive or negative ratio will take upon a value closest to M1 or M2. Thus, in the inspections that are subsequently carried out, the false positive and negative ratios can be maintained at values close to the set values M1 and M2 unless the quality of the substrates changes drastically after the component mounting process and the burden on the user for the correction of judgment reference values can be significantly reduced.

Although FIG. 7 shows an example wherein the judgment reference values are initialized based on the range in the NG histogram with frequency of zero, the initialization may be based on the range in the OK histogram where frequency was calculated. In such a case, the judgment reference values must be changed in Steps ST104 and ST108 such that the range of "OK" is reduced.

However, the initial judgment reference values need not be based on the frequency distribution in a histogram. Instead, the judgment reference value to be corrected (used in the inspection of displacements) may be used as the initial value, except that the process shown in FIG. 7 must be modified somewhat.

When the set false negative ratio value M1 is specified so as to be larger than the present value, for example, processes similar to Steps ST104-ST107 of FIG. 7 may be carried out with a judgment reference value which is the object of correction being used as the initial value. When the set false negative ratio value M1 is specified so as to be smaller than the present value, on the other hand, Steps ST104 and ST105 are repeated while the judgment reference values are changed such that the range of "OK" is reduced until the value of P1 becomes smaller than M1, Step ST112 being carried out thereafter. If the set false positive ratio value M2 is specified so as to be smaller than the present value, processes similar to Steps ST108-ST111 of FIG. 7 may be carried out with a judgment reference value which is the object of correction being used as the initial value. If the set false positive ratio value M2 is specified so as to be larger than the present value, on the other hand, Steps ST109 and ST110 may be repeated while the judgment reference values are changed such that the range of "OK" is reduced until the value of P2 becomes smaller than M2, Step ST112 being carried out thereafter.

By the processes of FIGS. 6 and 7, since the allowable range of the false positive or negative ratio is specified for each component and the judgment reference values are adjusted according to this specified range, judgment reference values can be set precisely even for components which are difficult to handle when they finally become defective. Since occurrence of defects in the final process can be prevented if the allowable range for the false positive ratio is set to be small for components such as very small chip components and BGA which are difficult to correct after the soldering process or are expensive, it is possible to prevent a situation where a substrate itself will have to be discarded because of the defects in such components.

Although an example wherein an already set judgment reference value is corrected has been explained above, a similar method may be used to initially set a judgment reference value of the first inspection device 1A. In this case, the judgment reference values on the side of the second inspection device 1B for carrying out inspection on the final process are determined first and thereafter a specified number of substrates are used to carry out the measurement of displacements after the component mounting process and a test inspection of substrates after the soldering process, and their results are used to automatically set the judgment reference values for the inspection of displacements for each component. In this case, the false positive and negative ratios need not be specified for each component. Values common to all components may be specified.

Although the judgment reference values are corrected for each component according to the example described above, this is not intended to limit the scope of the invention. If the same judgment reference value is to be used for components of the same kind with the surrounding densities of mounting on the same level, for example, the correction of judgment reference value may be carried out in units of groups of these components.

Although the example described above was for setting judgment reference values for the inspection of displacements of components on a substrate after the component mounting process, appropriate judgment reference values may be set similarly by using measurement values used in the inspection and the results of the final inspection also when the amount of the applied cream solder and the displacement of solder are inspected.

Although an example was shown above wherein the data processor 2 was used to correct the judgment reference values for the first inspection device 1A, it may be so arranged that the first inspection device 1A corrects the judgment reference values by a similar method. In such a case, the results of the final inspection are transmitted from the second inspection device 1B to the first inspection device 1A.

What is claimed is:

1. A method of setting an optimum reference value for judging a measured value of a target portion for inspection of substrates having components mounted thereto after an intermediate process, said substrates being produced through a plurality of production processes inclusive of said intermediate process and a final process that is the last of said production processes, said method comprising the steps of:

measuring each of target portions on a plurality of substrates of a same kind individually in a measurement process after said intermediate process is carried out, judging mounted condition of each component in a judgment process after said final process is carried out, and saving results of the steps of measuring and judging in a memory;

repeating, after a step of initializing a reference value regarding target portions for inspection that use a reference value in common among said plurality of substrates, a process of calculating the number of substrates for which measured values within a range of NG meaning no good or OK meaning good have been obtained according to said reference value and for each of which a judgment of OK or NG has been respectively given in said judgment process after said final process, said process of calculating being repeated by varying said reference value; and setting said reference value as said optimum reference value when the ratio of said calculated number of substrates with respect to the total number of substrates for which said results are saved in said memory is within a preliminarily set allowable range of frequency of occurrence of disagreement in judgment in inspections after said intermediate process and said final process;

wherein the step of initializing a reference value comprises, if no reference value has been set by a user, if no reference data indicate a reference value, and if said method is not being used for correcting an already set reference value, the steps of:

retrieving out of said memory measured values obtained in said measurement process after said intermediate process regarding substrates for which judgment results of OK or NG were obtained in said judgment process after said final process on a target portion for which said reference value was used in common among said plurality of substrates; and defining as initial value of said reference value a measured value corresponding to a boundary position between a range in which said retrieved measured values are distributed and another range in which said retrieved measured values are not distributed;

wherein the step of initializing a reference value comprises, if a reference value has been set by a user, the step of defining said reference value set by said user as initial value of said reference value;

wherein the step of initializing a reference value comprises, if reference data indicate a reference value, the step of defining said reference value indicated by said reference data as initial value of said reference value; and wherein the step of initializing a reference value, if said method is being used for correcting an already set reference value, the step of defining said already set reference value as initial value of said reference value.

2. The method of claim 1 further comprising the step of calculating, after the step of initializing a reference value is carried out, the number of substrates for which said target portion for inspection was judged to be OK in said judgment process after said final process and for which a measured value within the range of NG according to the reference value was obtained.

3. The method of claim 1 further comprising the step of calculating, after the step of initializing a reference value is carried out, the number of substrates for which said target portion for inspection was judged to be NG in said judgment process after said final process and for which a measured value within the range of OK according to the reference value was obtained.

4. A device for setting an optimum reference value for judging a measured value of a target portion for inspection of substrates having components mounted thereto after an intermediate process, said substrates being produced through a plurality of production processes inclusive of said intermediate process and a final process that is the last of said production processes, said device comprising:

first input means for inputting measurement results on target portions for inspection from an inspection device associated with said intermediate process and judgment results on said target components from another inspection device associated with said final process;

a memory for storing data inputted from said first input means;

second input means for inputting data on an allowed value related to frequency of occurrence of disagreement between said measurement results and said judgment results;

reference setting means for using the data stored in said memory and said allowed value inputted by said second input means and thereby setting a reference value corresponding to target portions for inspection that use said reference value in common among a plurality of substrates of a same kind; and output means for outputting said reference value set by said reference setting means to said inspection device associated with said intermediate process;

wherein said reference setting means repeats over target portions for processing, after a step of initializing said reference value, the process of calculating the number of substrates for which measured values within a range of NG meaning no good or OK meaning good have been obtained according to said reference value and for each of which a judgment of OK or NG has been respectively given in said final process while varying said reference value and sets as optimum reference value the value of said reference value when the ratio of said calculated number of substrates with respect to the total number of substrates for which the measurement results and the judgment results are stored in said memory corresponds to said allowed value;

wherein the step of initializing said reference value comprises, if no reference value has been set by a user, if no reference data indicate a reference value, and if said method is not being used for correcting an already set reference value, the steps of:

retrieving out of said memory measured values obtained in said measurement process after said intermediate process regarding substrates for which judgment results of OK or NG were obtained in said judgment process after said final process on a target portion for which said reference value was used in common among said plurality of substrates; and defining as initial value of said reference value a measured value corresponding to a boundary position between a range in which said retrieved measured values are distributed and another range in which said retrieved measured values are not distributed;

wherein the step of initializing said reference value comprises, if a reference value has been set by a user, the step of defining said reference value set by said user as initial value of said reference value;

wherein the step of initializing said reference value comprises, if reference data indicate a reference value, the step of defining said reference value indicated by said reference data as initial value of said reference value; and wherein the step of initializing said reference value, if said device is being used for correcting an already set reference value, the step of defining said already set reference value as initial value of said reference value.

5. A computer-readable medium encoding a program for having a computer to carry out a reference-setting process for setting an optimum reference value for judging a measured value of a target portion for inspection for inspection of substrates having components mounted thereto after an intermediate process, said substrates being produced through a plurality of production processes inclusive of said intermediate process and a final process that is the last of said production processes, said reference-setting process comprising:

a data-saving step of saving in a memory of said computer measurement results on target portions for inspection by an inspection device associated with said intermediate process and judgment results on said target portions for inspection by another inspection device associated with said final process; and a reference-setting step of using, when a target value related to frequency of occurrence of disagreement between said measurement results and said judgment results is inputted to said computer, the data saved in said memory and said target value inputted to said computer to set a reference value corresponding to target portions for inspection that use said reference value in common among a plurality of substrates of a same kind;

wherein said reference-setting step is repeated over target portions for processing, after a step of initializing said reference value regarding a target portion for inspection, the process of calculating the number of substrates for which measured values within a range of NG meaning no good or OK meaning good have been obtained according to said reference value and for each of which a judgment of OK or NG has been respectively given in said final process while varying said reference value and sets as optimum reference value the value of said reference value when the ratio of said calculated number of substrates with respect to the total number of substrates for which the measurement results and the judgment results are stored in said memory corresponds to said target value;

wherein the step of initializing said reference value comprises, if no reference value has been set by a user, if no reference data indicate a reference value, and if said method is not being used for correcting an already set reference value, the steps of:

retrieving out of said memory measured values obtained in said measurement process after said intermediate process regarding substrates for which judgment results of OK or NG were obtained in said judgment process after said final process on a target portion for which said reference value was used in common among said plurality of substrates; and defining as initial value of said reference value a measured value corresponding to a boundary position between a range in which said retrieved measured values are distributed and another range in which said retrieved measured values are not distributed;

wherein the step of initializing said reference value comprises, if a reference value has been set by a user, the step of defining said reference value set by said user as initial value of said reference value;

wherein the step of initializing said reference value comprises, if reference data indicate a reference value, the step of defining said reference value indicated by said reference data as initial value of said reference value; and wherein the step of initializing said reference value, if said medium is being used for correcting an already set reference value, the step of defining said already set reference value as initial value of said reference value.

* * * * *